US012672253B2

(12) United States Patent
Tong et al.

(10) Patent No.: US 12,672,253 B2
(45) Date of Patent: Jun. 30, 2026

(54) REINFORCED SLIDE RAIL FOR SERVER SLIDES

(71) Applicant: Asia Pacific CIS (Wuxi) Co., Ltd., Wuxi (CN)

(72) Inventors: Jun Tong, Wuxi (CN); Jichao Wang, Wuxi (CN); Jiafeng Wang, Wuxi (CN)

(73) Assignee: Asia Pacific CIS (Wuxi) Co., Ltd., Wuxi (CN)

( * ) Notice: Subject to any disclaimer, the term of this patent is extended or adjusted under 35 U.S.C. 154(b) by 91 days.

(21) Appl. No.: 18/954,191

(22) Filed: Nov. 20, 2024

(65) Prior Publication Data

US 2025/0169021 A1 May 22, 2025

(30) Foreign Application Priority Data

Nov. 20, 2023 (CN) .......................... 202311544332.1

(51) Int. Cl.
H05K 7/14 (2006.01)
A47B 88/493 (2017.01)

(52) U.S. Cl.
CPC ......... H05K 7/1489 (2013.01); A47B 88/493 (2017.01)

(58) Field of Classification Search
CPC . A47B 2210/0081; A47B 88/40; A47B 88/49; A47B 88/493; H05K 7/1489
See application file for complete search history.

(56) References Cited

U.S. PATENT DOCUMENTS

| | | | | | |
|---|---|---|---|---|---|
| 3,278,250 | A | * | 10/1966 | Vogt | A47B 88/493 |
| | | | | | 312/334.44 |
| 5,895,101 | A | * | 4/1999 | Cabrales | A47B 88/493 |
| | | | | | 312/334.17 |
| 8,251,465 | B2 | * | 8/2012 | Yu | H05K 7/1489 |
| | | | | | 312/334.7 |
| 8,371,667 | B2 | * | 2/2013 | Yu | A47B 88/49 |
| | | | | | 312/334.8 |
| 8,721,012 | B2 | | 5/2014 | Chen et al. | |
| 8,740,321 | B2 | * | 6/2014 | Yu | A47B 88/493 |
| | | | | | 312/334.8 |
| 8,967,744 | B2 | | 3/2015 | Chen et al. | |
| 9,144,173 | B2 | | 9/2015 | Chen et al. | |
| 9,155,386 | B2 | * | 10/2015 | Hashemi | A47B 88/493 |
| 9,313,914 | B2 | | 4/2016 | Judge et al. | |
| 9,538,679 | B1 | * | 1/2017 | Lin | H05K 7/14325 |

(Continued)

FOREIGN PATENT DOCUMENTS

CN      102525149 A      7/2012
CN      105722367 A      6/2016

(Continued)

*Primary Examiner* — Adrian S Wilson
(74) *Attorney, Agent, or Firm* — Quarles & Brady LLP

(57) ABSTRACT

A server slide can include a first (e.g., chassis) rail and a second (e.g., reinforced intermediate) rail assembly that slidably receives the first rail. The reinforced intermediate rail assembly may include a second (e.g., intermediate) rail having a recessed portion defining a height and a reinforcement bracket fixed to the intermediate rail. In one example, the reinforcement bracket may define a height larger than the height of the recessed portion of the intermediate rail. In one example, the reinforcement bracket may extend from a first end of the intermediate rail past a midpoint of the intermediate rail.

15 Claims, 12 Drawing Sheets

(56)                References Cited

U.S. PATENT DOCUMENTS

|  |  |  |  |  |
|---|---|---|---|---|
| 9,848,701 | B1 | 12/2017 | Chen | |
| 9,850,944 | B2 * | 12/2017 | Hashemi | H05K 7/1489 |
| 9,861,197 | B2 | 1/2018 | Chen et al. | |
| 9,894,993 | B2 * | 2/2018 | Chen | F16C 29/005 |
| 10,015,902 | B2 * | 7/2018 | Chen | H05K 7/1489 |
| 10,117,352 | B2 | 10/2018 | Chen et al. | |
| 10,306,983 | B2 | 6/2019 | Chen et al. | |
| 10,314,196 | B2 | 6/2019 | Chen | |
| 10,349,742 | B2 | 7/2019 | Chen et al. | |
| 10,356,937 | B2 | 7/2019 | Chen et al. | |
| 10,383,248 | B1 | 8/2019 | Chen et al. | |
| 10,499,738 | B2 * | 12/2019 | Chen | F16C 29/04 |
| 10,602,637 | B2 | 3/2020 | Chen | |
| 10,631,638 | B2 | 4/2020 | Chen et al. | |
| 10,729,241 | B2 | 8/2020 | Chen et al. | |
| 10,871,186 | B1 | 12/2020 | Chen et al. | |
| 11,160,371 | B2 | 11/2021 | Chen et al. | |
| 11,246,410 | B2 | 2/2022 | Chen et al. | |
| 11,406,187 | B2 | 8/2022 | Chen et al. | |
| 11,412,851 | B2 | 8/2022 | Chen et al. | |
| 11,607,040 | B2 | 3/2023 | Chen et al. | |
| 11,778,770 | B1 | 10/2023 | Chen | |
| 2002/0057042 | A1 * | 5/2002 | Milligan | A47B 88/49 312/334.46 |
| 2003/0071548 | A1 * | 4/2003 | Milligan | F16C 29/063 312/334.11 |
| 2003/0106863 | A1 * | 6/2003 | Lauchner | H05K 7/1489 312/334.8 |
| 2004/0227441 | A1 * | 11/2004 | Wang | A47B 88/49 312/334.8 |
| 2006/0152115 | A1 * | 7/2006 | Dubon | A47B 88/43 312/334.8 |
| 2007/0021048 | A1 * | 1/2007 | Henning | B60P 7/14 454/118 |
| 2011/0091141 | A1 * | 4/2011 | Liang | H05K 7/1489 384/20 |
| 2021/0148403 | A1 | 5/2021 | Chen et al. | |
| 2022/0395095 | A1 | 12/2022 | Chen et al. | |
| 2023/0099003 | A1 | 3/2023 | Chen et al. | |
| 2024/0114643 | A1 * | 4/2024 | Yu | A47B 88/57 |

FOREIGN PATENT DOCUMENTS

|  |  |  |  |  |  |
|---|---|---|---|---|---|
| CN | 107960038 | A | | 4/2018 | |
| CN | 216491544 | U | * | 5/2022 | |
| CN | 116439520 | A | | 7/2023 | |
| EP | 1501699 | B1 | * | 12/2006 | B60N 2/073 |
| EP | 2764796 | B1 | | 1/2015 | |
| JP | H0936557 | A | * | 2/1997 | |
| TW | 201018369 | A | * | 5/2010 | H05K 7/1489 |

* cited by examiner

REINFORCED SLIDE RAIL FOR SERVER SLIDES

CROSS-REFERENCE TO RELATED APPLICATION

This application claims priority to Chinese Invention patent application No. 202311544332.1, filed Nov. 20, 2023, which is herein incorporated by reference in its entirety.

BACKGROUND

Slides (e.g., server rack slides) may allow a user to selectively access a server chassis secured within a server rack. For example, the slides may support the server chassis and allow a user to expand the slides (e.g., telescope slides away from server rack) to access the server chassis (e.g., for maintenance). However, during expansion of the slides, an increasing force (e.g., torque) may be applied to the slides (e.g., via the weight of the server chassis). This increasing force may cause a failure (e.g., bending, breaking) of the slides, which may result in unintended server downtime or costs.

SUMMARY

Some embodiments of the invention provide a server slide assembly including a first (e.g., chassis) rail and a second (e.g., reinforced intermediate) rail assembly that slidably receives the first rail. The reinforced intermediate rail assembly may include a second (e.g., intermediate) rail having a recessed portion defining a height and a reinforcement bracket fixed to the intermediate rail. In one example, the reinforcement bracket may define a height larger than the height of the recessed portion of the intermediate rail. In one example, the reinforcement bracket may extend from a first end of the intermediate rail past a midpoint of the intermediate rail.

Some embodiments of the invention provide a method of manufacturing a reinforced slide rail assembly for a server slide. The method may include arranging a reinforcement bracket so that the reinforcement bracket extends along and also out of a recessed portion of a reinforced rail. In one example, the reinforcement bracket defines a height larger than a height of the recessed portion of the reinforced rail. The method may further include securing the reinforcement bracket to a surface of the reinforced rail, and fastening a pull rod to the reinforced rail and to the reinforcement bracket. In one example, the pull rod is secured to the reinforced rail through a cutout defined by the reinforcement bracket.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
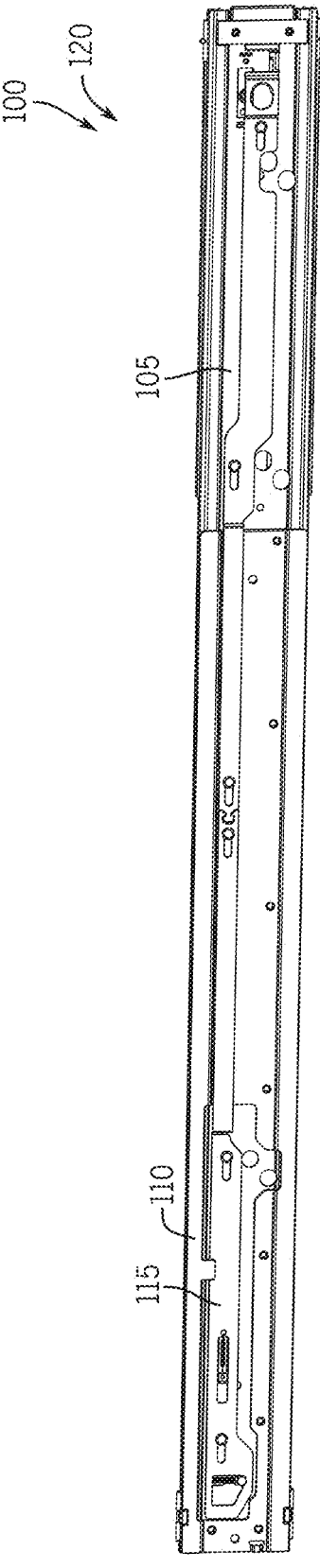
FIG. 1 is a perspective view of a portion of a server slide assembly including a reinforced intermediate rail assembly according to aspects of the present disclosure.

The following discussion is presented to enable a person skilled in the art to make and use embodiments of the invention. Given the benefit of this disclosure, various modifications to the illustrated embodiments will be readily apparent to those skilled in the art, and the principles herein can be applied to other embodiments and applications without departing from embodiments of the invention. Thus, embodiments of the invention are not intended to be limited to embodiments shown, but are to be accorded the widest scope consistent with the principles and features disclosed herein.

The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

In one example, a server slide assembly may include a reinforced intermediate rail assembly configured to increase overall structural integrity of the server slide assembly. For example, the reinforced intermediate rail assembly may include a reinforcement bracket secured to an intermediate (or other) rail. The reinforcement bracket may extend along a height of the intermediate rail so that the reinforcement bracket defines a height that is substantially equal to a height of the intermediate rail (e.g., with the reinforcement bracket extending along an entire height of the intermediate rail). In this regard, as used herein, "height" indicates a measurement along a direction that is transverse to a sliding direction of a slide assembly. For reference, the height direction accordingly typically aligns with the vertical direction for slides installed for conventional support of horizontal server racks.

In another example, the reinforcement bracket may include a length that extends past a midpoint of the intermediate rail. For example, the reinforcement bracket may extend from a first (e.g., rear) end of the intermediate rail past the midpoint of the intermediate rail. In another example, the reinforcement bracket may include a surface profile that matches a surface profile of the intermediate rail (e.g., is congruent to the surface profile, within manufacturing tolerances), so that the reinforcement bracket abuts the intermediate rail without any gaps along a majority of the interface area between the two parts (e.g., so that the reinforcement bracket is flush with the intermediate rail over an area substantially equal to an interface area between the material of the intermediate rail and the material of the reinforcement bracket).

In one example, the reinforcement bracket may be positioned between the intermediate rail and a cabinet rail of the server slide assembly (or between other rails of a slide assembly). Additionally, a first (e.g., rear) end of the reinforcement bracket may include a protrusion configured to contact a portion of the cabinet rail to provide a stop to relative movement of the rails (e.g., prevent over-insertion of the reinforced intermediate rail into the cabinet rail).

In one example, the reinforced intermediate rail assembly may include a pull rod configured to lock or unlock relative telescopic movement of the intermediate rail relative to the cabinet rail. In one example, the pull rod may include one or more sections (e.g., a first section and a section section) that are separately formed and then secured together to form the pull rod as part of a manufacturing process for the relevant rail assembly. In one example, the first section of the pull rod may include a jog or step transitioning the pull rod from a first stepped-down portion to a stepped-up portion. Correspondingly, the second section of the pull rod may include a jog or step transitioning the pull rod from the stepped-up portion to a second stepped-down portion. In other words, stepped-up and stepped-down portions of a pull rod can extend along separate planes to accommodate different thicknesses of a rail assembly (e.g., relative to the presence or absence of a reinforcement member along a particular portion of an intermediate rail).

In one example, the first stepped-down portion of the first section facilitates a slidable connection of the pull rod to the intermediate rail through a cutout defined by the reinforcement bracket. Correspondingly, the stepped-up portion of the first and second sections facilitates the connection of the pull rod to the reinforcement bracket. Additionally, the second stepped-down portion of the second section facilitates the connection of the pull rod to the intermediate rail past a terminal end of the reinforcement bracket. This configuration enables a user to manufacture the reinforced intermediate rail with only a single size (e.g., length) of fastener (e.g., rivet), which increases overall manufacturing efficiency.

Additionally, to reduce the overall number of fasteners (e.g., rivets) needed during manufacturing, the cutout may include a tooth or other projection extending away from an interior surface of the cutout. The projection may abut a portion of the first stepped-down portion of the pull rod to prevent separation of the pull rod from the surface of the intermediate rail during actuation of the pull rod.

Figure 2:
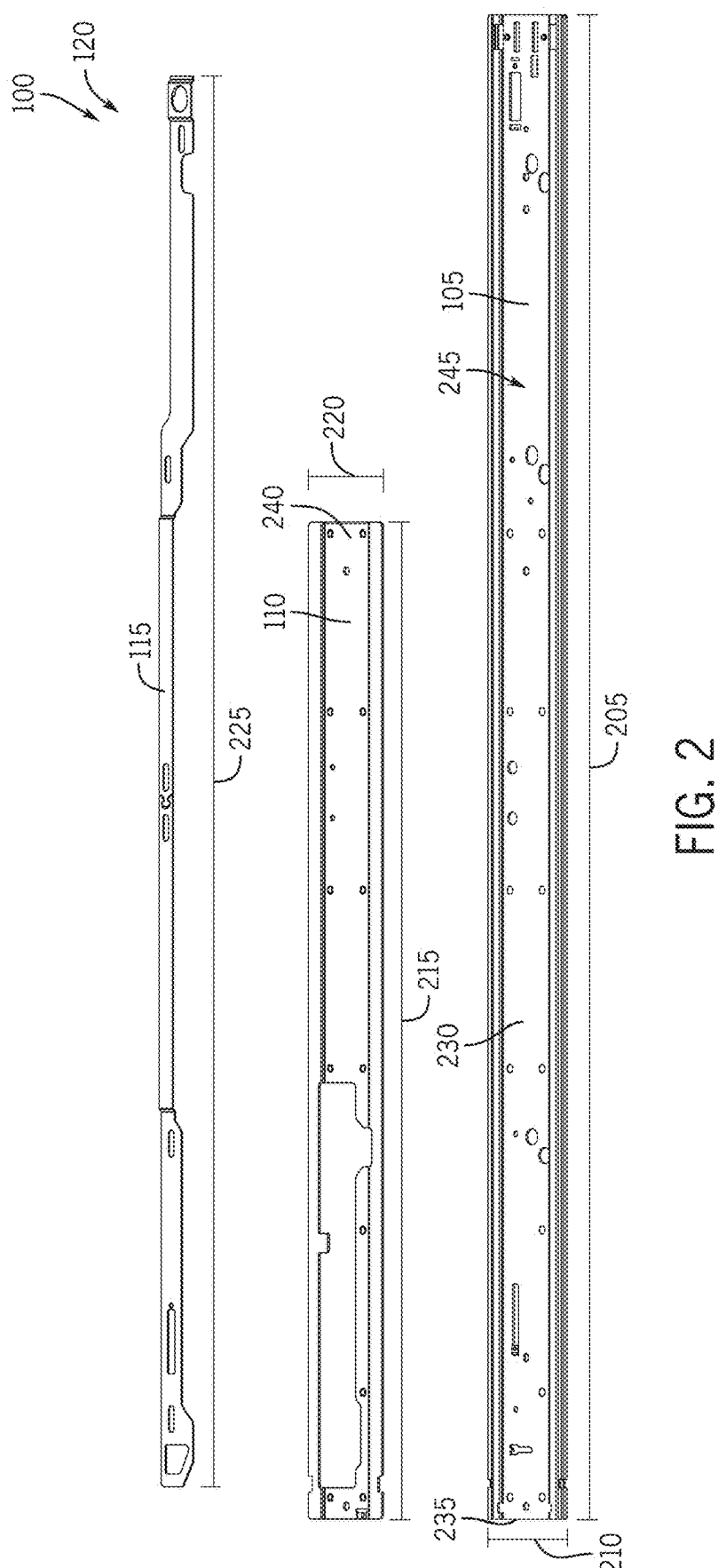
FIG. 2 is an exploded view of the reinforced intermediate rail assembly of FIG. 1.
Figure 3:
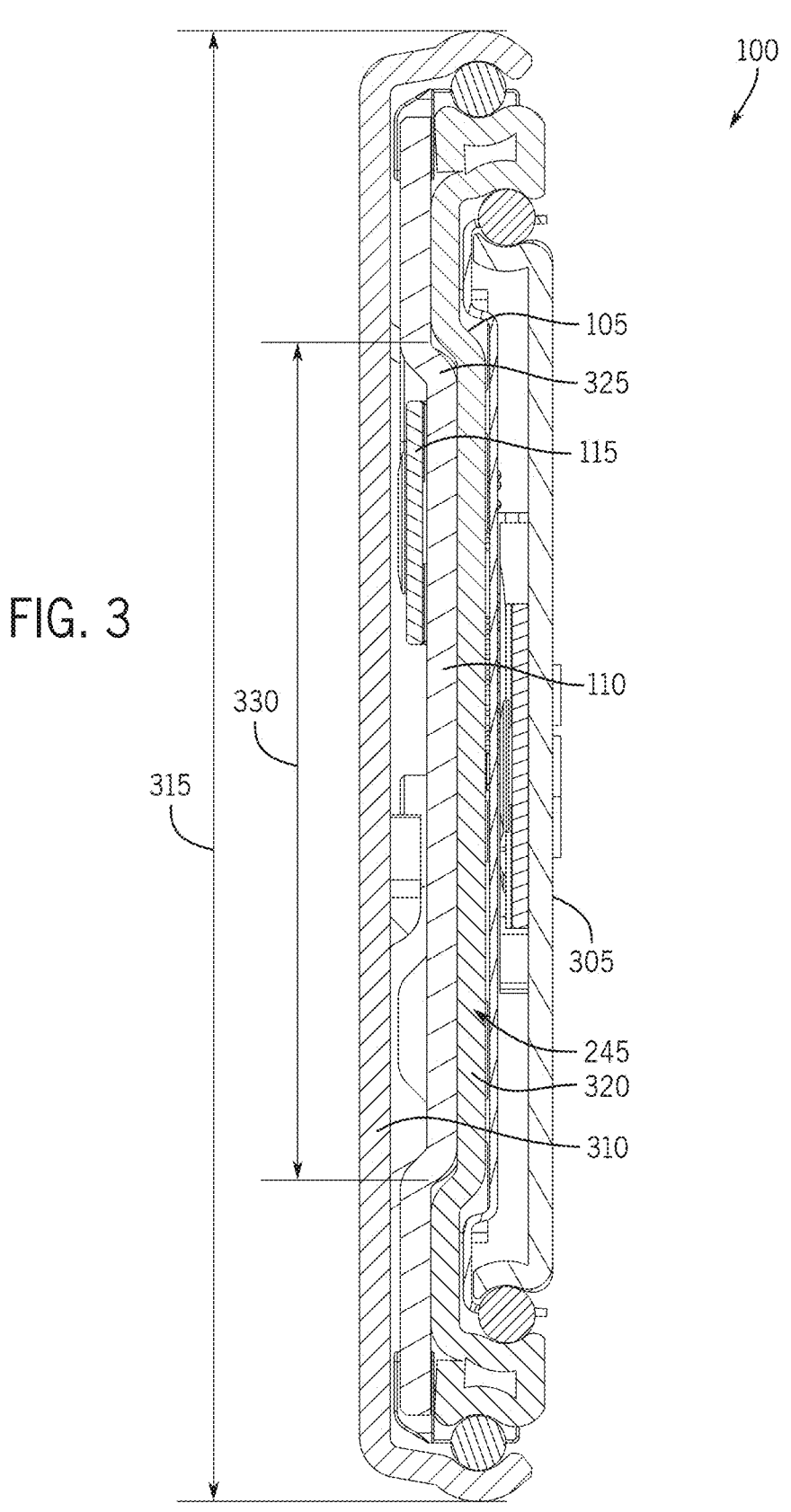
FIG. 3 is a cross-sectional view of the server slide assembly of FIG. 1.
Figure 4:
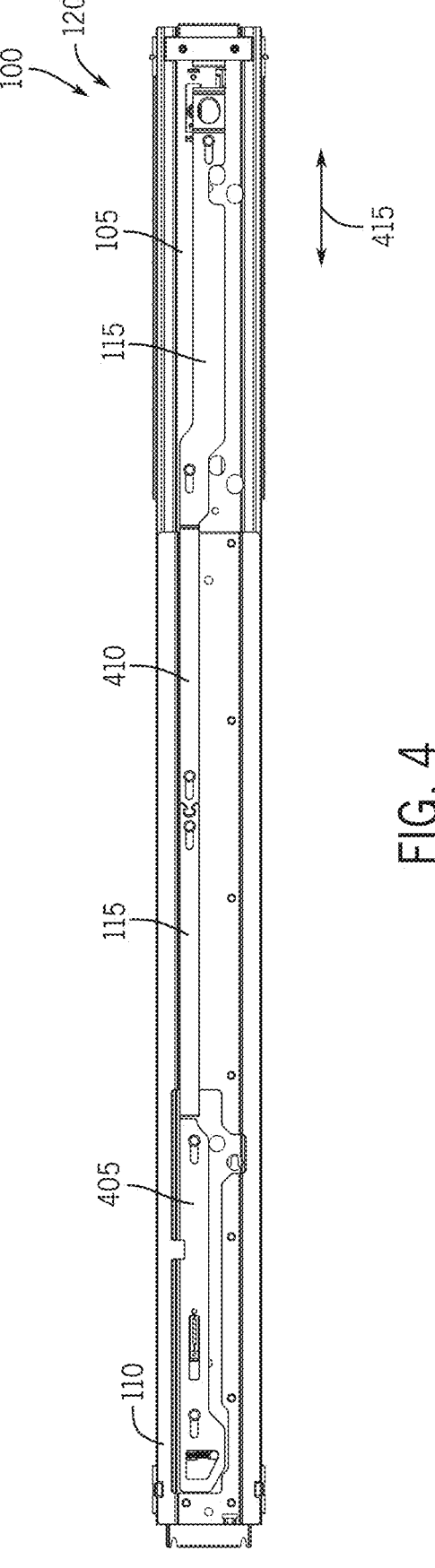
FIG. 4 is a side view of the reinforced intermediate rail assembly of FIG. 1.

FIGS. 1-3 illustrate an example of a server slide assembly 100. The server slide assembly 100 may include a reinforced second (e.g., intermediate) rail assembly 120, which includes a second (e.g., intermediate) rail 105, a reinforcement bracket 110, and a pull rod 115. In one example, the reinforced intermediate rail assembly 120 permits a user to extend (e.g., telescope) the server slide assembly 100 into a fully-extended position, with a reduced risk of failure (e.g., breaking/bending) of the intermediate rail 105 due to a torque or other force generated by a server chassis secured to the server slide assembly 100.

In one example, the server slide assembly 100 may include a first (e.g., chassis) rail 305 nested within the intermediate rail 105. The chassis rail 305 may be secured to one or more sides of a server chassis to slidably secure the server chassis to the server slide assembly 100. Correspondingly, the second (e.g., intermediate) rail 105 may be nested within a third (e.g., cabinet) rail 310. In one example, the third (e.g., cabinet) rail 310 may be secured to an interior of a server cabinet or housing. Thus, both the chassis rail 305 and the intermediate rail 105 may telescope (e.g., expand/contract) within the cabinet rail 310 to increase or decrease an overall length of the server slide assembly 100. For example, a user may expand the server slide assembly 100 to access the server chassis for replacement or maintenance and contract the server slide assembly 100 to store the server chassis within the server cabinet.

In one example, the reinforcement bracket 110 may be secured to a surface 230 (e.g., a first-side face) of the intermediate rail 105, between the intermediate rail 105 and the cabinet rail 310. For example, the reinforcement bracket 110 may be secured to the surface 230 of the intermediate rail 105 via one or more fasteners (e.g., rivets, screws, nails, adhesive, welds, bolts, nuts, or any other known fastener). To maximize overall load support capabilities of the intermediate rail 105, the reinforcement bracket 110 may extend a relatively large portion of the height 210 of the intermediate rail 105. In some examples, including as shown, the reinforcement bracket 110 may define a height 220 that is substantially equal to the height 210 of the intermediate rail 105 or to an overall height 315 of the server slide assembly 100. For example, the height 220 may in some cases be equal to the entirety of the height 210. In another example, the height 220 of the reinforcement bracket 110 may be greater than a height 330 of a recessed portion 245 of the intermediate rail 105, but less than entire height 210 of the intermediate rail.

Also as shown, the reinforcement bracket 110 may define a surface profile 325 that is substantially congruent to a surface profile 320 of the intermediate rail 105. Thus, for example, the reinforcement bracket 110 may to mate flush with the surface of the intermediate rail 105, without gaps between the intermediate rail 105 and the reinforcement bracket 110 (e.g., except at limited locations, including projections to secure a pull rod or other similar structures).

The reinforcement bracket 110 may further define a length 215 that extends from a first end 235 of the intermediate rail 105 past a midpoint (e.g., center) of the intermediate rail 105. Put differently, the intermediate rail 105 may define a length 205 and the reinforcement bracket 110 may extend from the first end 235 of the intermediate rail 105 at least 50 percent of the length 205 of the intermediate rail 105. In some examples, including as shown, a first end of the reinforcement bracket 110 may be aligned with the terminus of the intermediate rail 105 at the first end 235. In some examples, including as shown, the length 215 may be less than 80% of the length 205, to accommodate attachment and operation of other rail assembly components.

With continued references to FIGS. 1-3, the reinforced intermediate rail assembly 120 may further include a pull rod 115 configured to lock/unlock relative telescopic movement of the intermediate rail 105 with respect to the cabinet rail 310. In one example, the pull rod 115 may be positioned between the reinforcement bracket 110 and the cabinet rail 310. Generally, the pull rod 115 may extend from a first end of the intermediate rail 105 to a second end of the intermediate rail 105. In some cases, the pull rod 115 may define a length 225 substantially equal to the length 205 of the intermediate rail 105, although other lengths are possible.

Looking to FIGS. 4-8, the pull rod 115 includes a first section 405 and a second section 410. In one example, the first section 405 and the second section 410 may be connected together via an interference or gap type connection 535 (see FIGS. 5 and 6). For example, the first section 405 may include an opening 545 at one end configured to receive a detent 540 extending from an end of the second section 410. The detent 540 of the second section 410 may slide within the opening 545 of the second section 410 so that a head 555 of the detent 540 is secured within the opening 545 via one or more arms 550 forming a necked-down portion of the opening 545. In another example, the first section 405 and the second section 410 may be integrated together so that the first section 405 and the second section 410 form a one-piece (e.g., unitary) pull rod 115, or other types of connections between separate rod sections can be used.

In one example, the first section 405 may include a step 530 configured to transition the first section 405 between a first stepped-down portion 705 and a stepped-up portion 715. In one example, the first stepped-down portion 705 may be positioned within a cutout 505 of the reinforcement bracket 110 so that the first stepped-down portion 705 is secured to the surface 230 of the intermediate rail 105. Put differently, the step 530 permits the first stepped-down portion 705 to sit flush with the surface 230 of the intermediate rail 105 within the cutout 505 of the reinforcement bracket 110 to facilitate actuation of the locking/unlocking mechanism operated via the pull rod 115.

Figure 7:
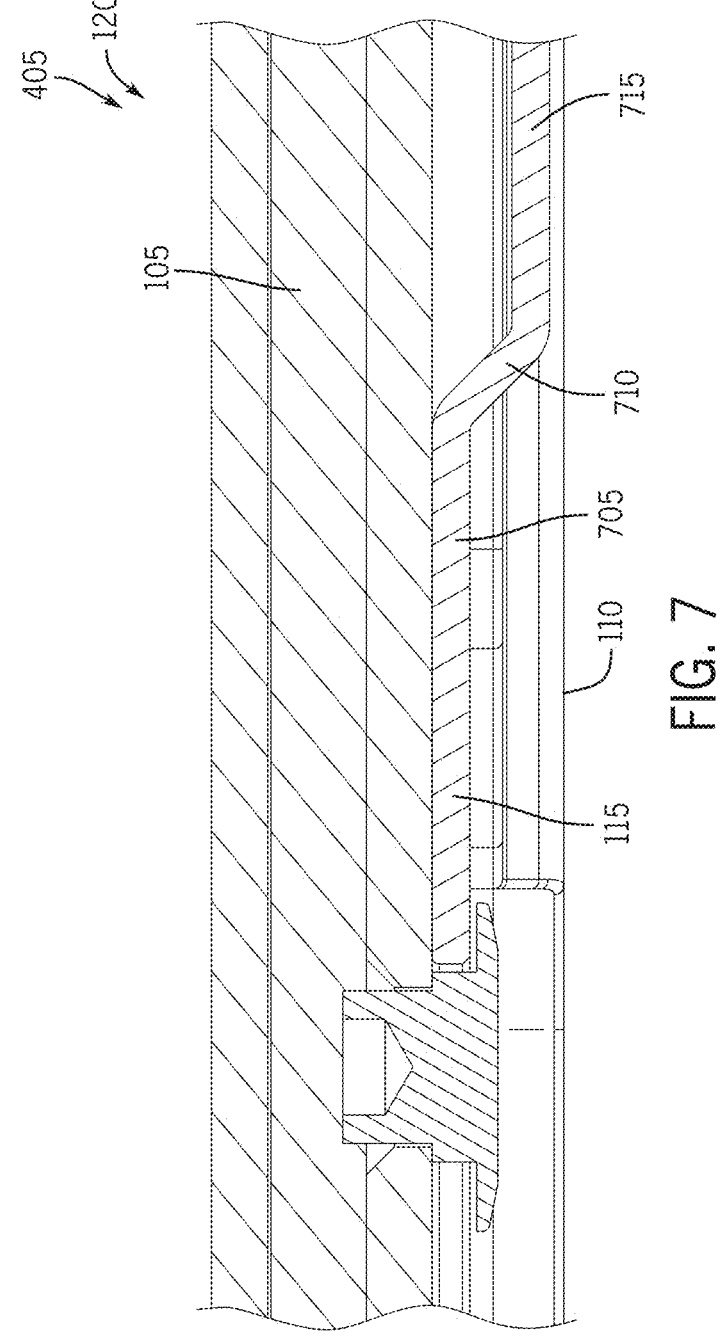
FIG. 7 is a cross-sectional view of the reinforced intermediate rail assembly of FIG. 1, along the first section of the pull rod of FIG. 5.
Figure 8:
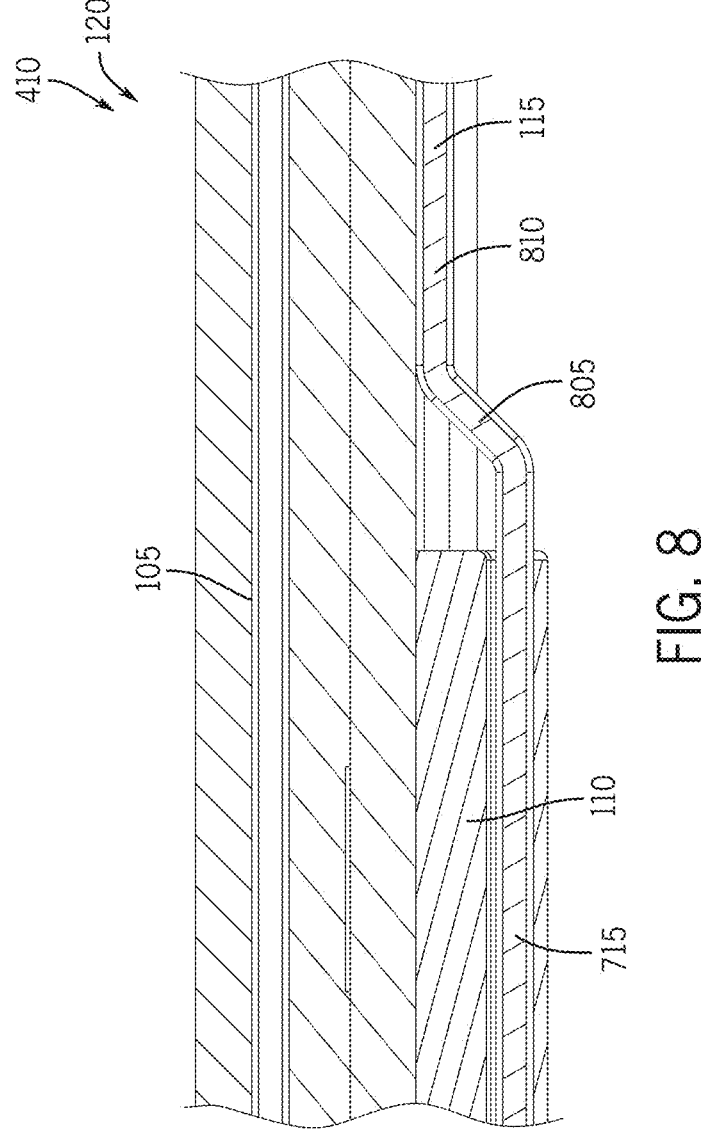
FIG. 8 is a cross-sectional partial view of the reinforced intermediate rail assembly of FIG. 1, along the second section of the pull rod of FIG. 6.

In one example, as shown in FIG. 7 in particular, the step 530 may include a transition portion 710 (e.g., an angled portion), which transitions the first section 405 of the pull rod 115 from the first stepped-down portion 705 to the stepped-up portion 715. The stepped-up portion 715 is configured to rest against a surface 240 of the reinforcement bracket 110. Put differently, the stepped-up portion 715 is configured to sit flush with the surface 240 of the reinforcement bracket 110.

Continuing, the stepped-up portion 715 may extend along the reinforcement bracket 110 through both the first section 405 and the second section 410 until reaching a termination end 610 of the reinforcement bracket 110. At or before the termination end 610 of the reinforcement bracket 110, the second section 410 of the pull rod 115 may include another step 605. Similar to the step 530, the step 605 includes a transition portion 805, which transitions the second section 410 from the stepped-up portion 715 to a second stepped-down portion 810 configured to rest against (e.g., sit flush with) the intermediate rail 105.

In one example, the pull rod 115 may be movably (e.g., slidably) secured to either the intermediate rail 105 or the reinforcement bracket 110 via one or more fasteners 520 (e.g., rivets) extending through one or more slots 525. For example, the pull rod 115 may be secured to the intermediate rail at both the first stepped-down portion 705 and the second stepped-down portion 810, but secured to the reinforcement bracket 110 at the stepped-up portion 715. In one example, the slots 525 may permit a user to actuate the pull rod 115 in the directions shown by arrow 415 to lock or unlock relative telescopic movement of the intermediate rail 105 with respect to the cabinet rail 310. In one example, actuation of the pull rod 115 may automatically lock telescopic movement of the intermediate rail 105 when the intermediate rail is extended.

Figure 6:
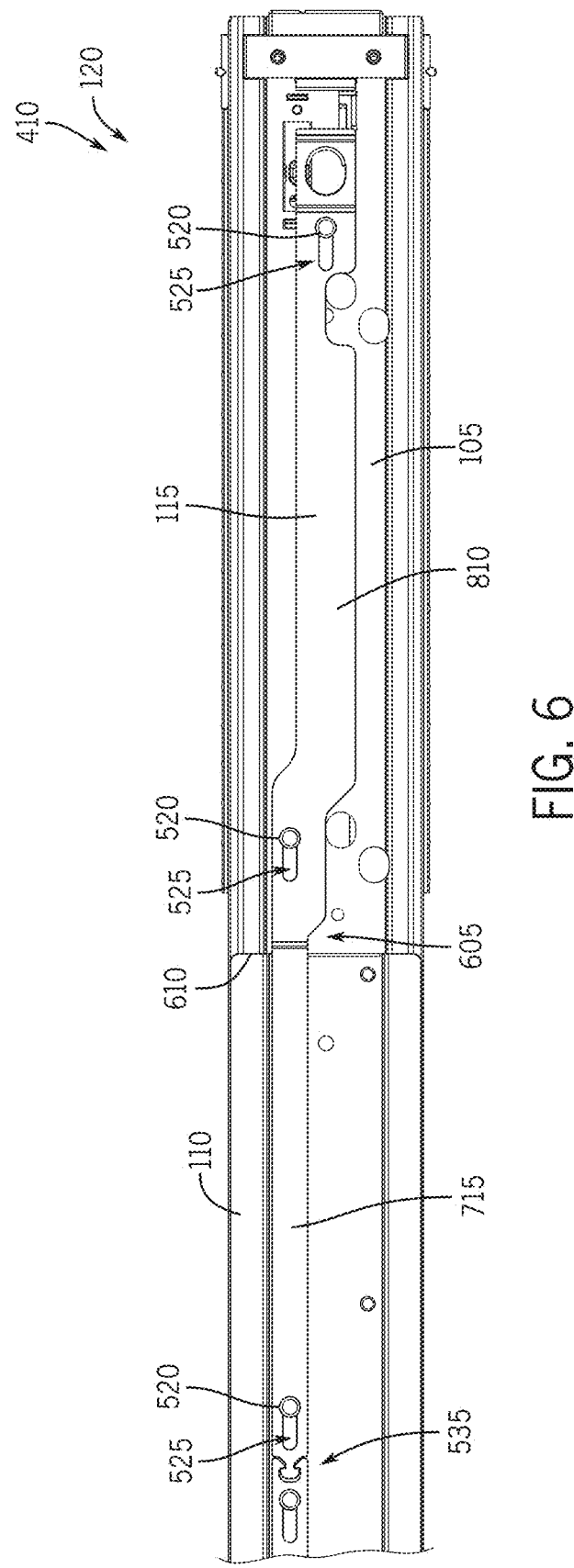
FIG. 6 is a side partial view of the reinforced intermediate rail assembly of FIG. 1 including a second section of the pull rod.

In one example, the stepped-up (or other) portion of the pull rod 115 can be beneficially aligned or supported by other structures on the assembly. For example, as shown in FIG. 6, a top edge of the pull rod 115 can be aligned along a lower edge of a top flange of the reinforcement bracket 110. In some cases, this can provide improved stability and reliability of movement for the pull rod 115 or can allow for easier installation during manufacturing. Correspondingly, a pull rod can include vertical stepped-up and stepped-down portions as well as (or instead of) laterally stepped-up and stepped-down portions. For example, as also shown in FIG. 6, the slot 525 toward the front of the assembly (i.e., to the right, as shown) is located on a centered, vertically stepped-down portion of the pull rod 115, whereas the slots 525 along the stepped-up portion 715 and a rearward part of the stepped-down portion 810 is located on a vertically stepped-up portion of the pull rod 115 that extends partly along the top flange of the bracket 110.

In one example, each of the fasteners 520 may be the same size (e.g., length), so that only a single type or dimension (e.g., length) of fastener 520 can be used during manufacture of the reinforced intermediate rail assembly 120. Put differently, each fastener (e.g., rivet) may extend only through a single material thickness before reaching the pull rod. For example, the fasteners securing the first and second stepped-down portions may need to extend only through the intermediate rail into the first and second stepped-down portion and the fasteners securing the stepped-up portion may extend only through the reinforcement bracket into the stepped-up portion. Thus, manufacturing efficiencies can be increased.

Figure 5:
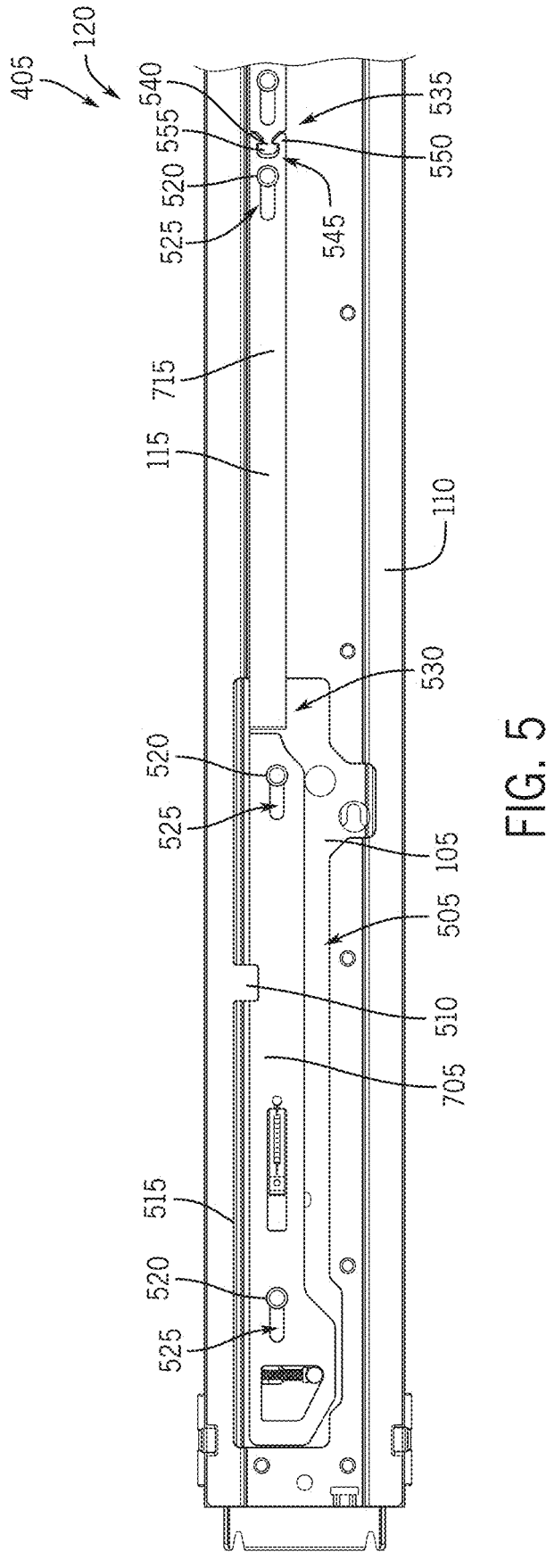
FIG. 5 is a side partial view of the reinforced intermediate rail assembly of FIG. 1 including a first section of a pull rod.

In one example, as shown in FIG. 5 in particular, the first stepped-down portion 705 may be further secured to the intermediate rail 105 via a projection configured as a tooth 510 extending away from an interior surface (e.g., edge) 515 of the cutout 505. For example, the tooth 510 may restrict lateral movement of the pull rod 115 to prevent the pull rod 115 from separating from the surface 230 of the intermediate rail 105 during actuation of the pull rod 115. As should be appreciated, the use of the tooth 510 (or other similar projection) can simplify the manufacturing process by mitigating the need to install another fastener (e.g., rivet) between the pull rod 115 and the intermediate rail 105.

Figure 9:
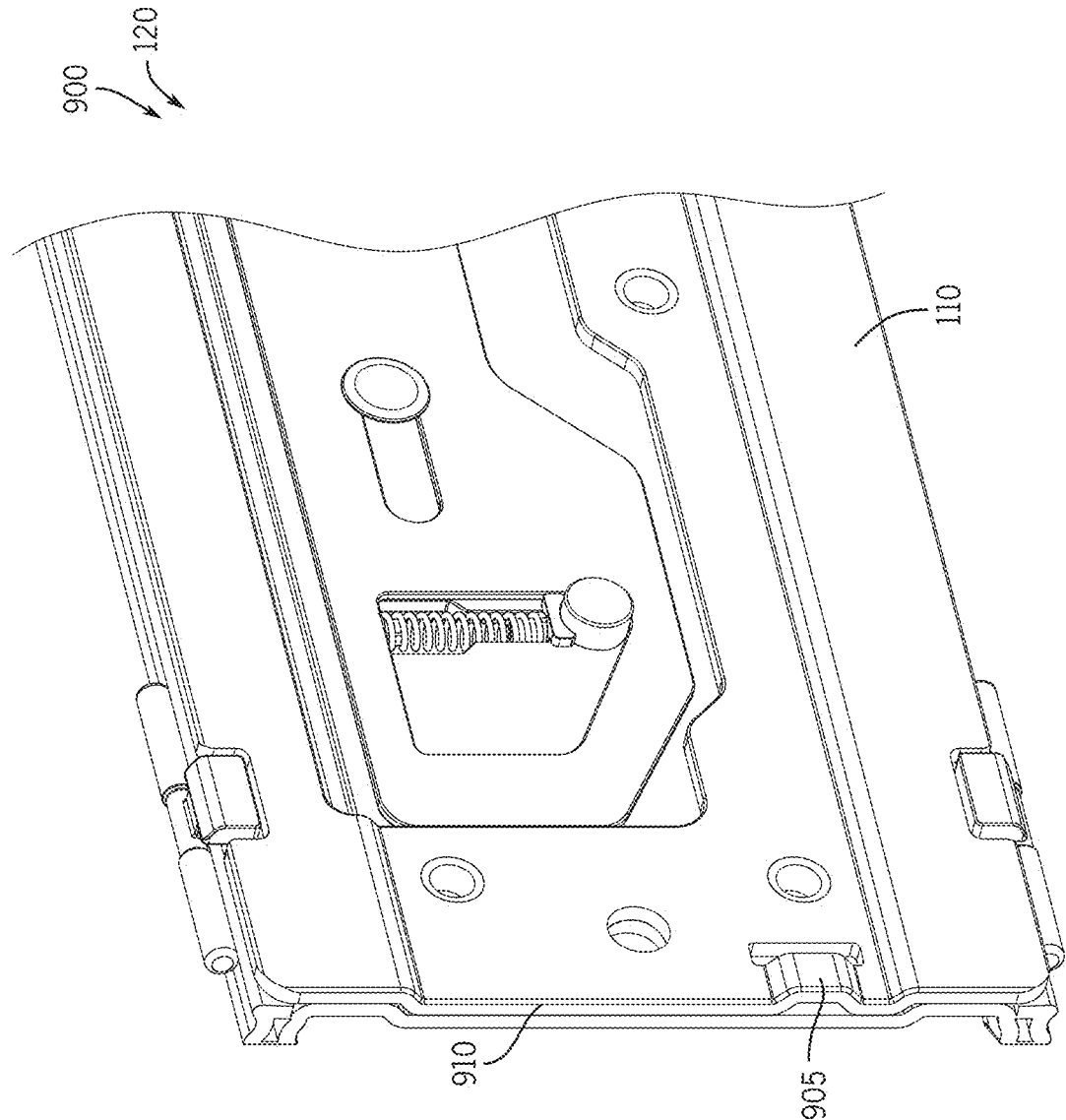
FIG. 9 is a perspective partial view of a slide stop assembly of the reinforced intermediate rail assembly of FIG. 1.
Figure 10:
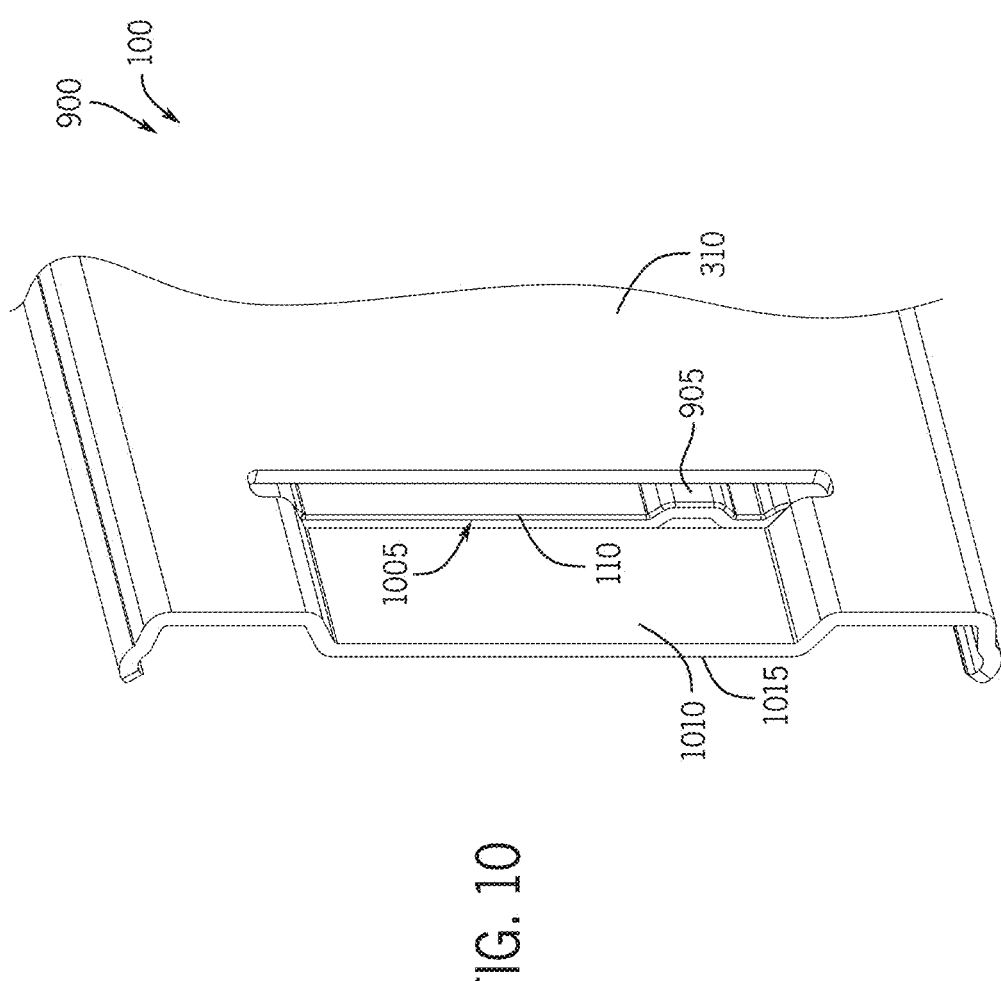
FIG. 10 is a perspective partial view of the slide stop assembly of FIG. 9 with the server slide assembly in a closed position.
Figure 11:
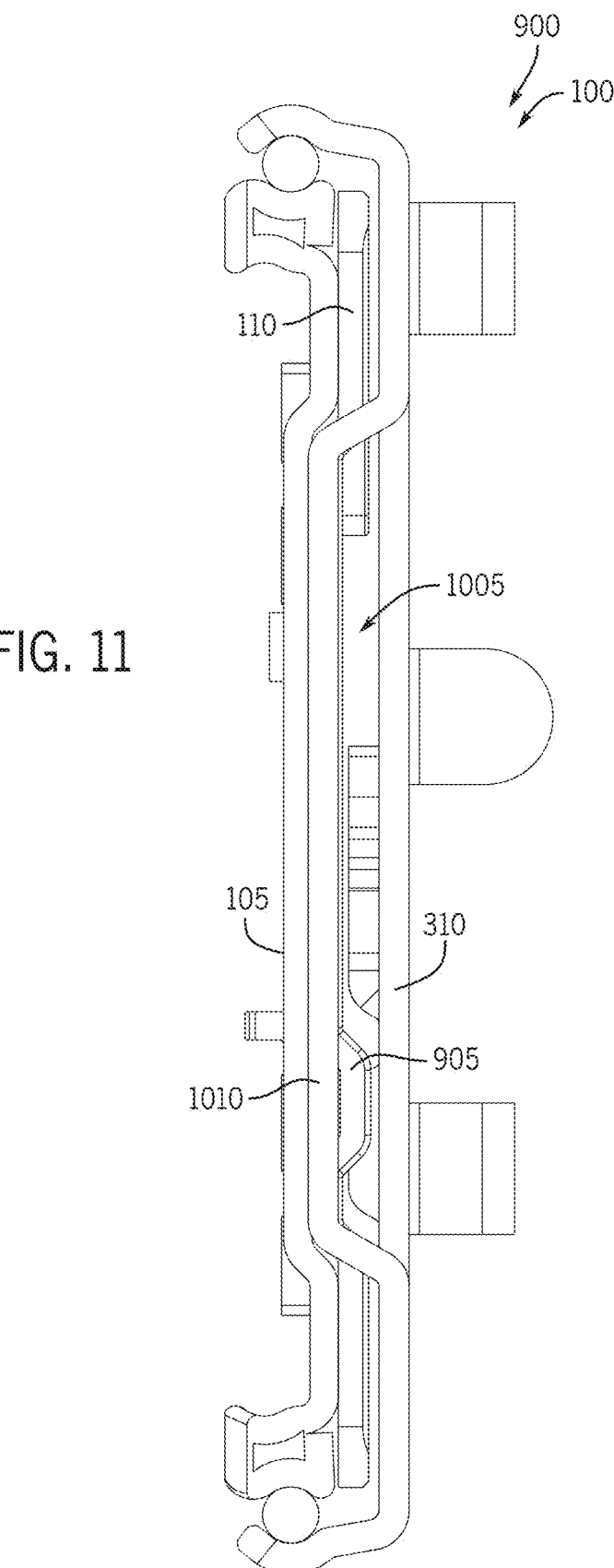
FIG. 11 is a first end view of the slide stop assembly of FIG. 9 with the server slide assembly in the closed position.

FIGS. 9-11 show an example of a slide stop assembly 900 of the server slide assembly 100. The slide stop assembly 900 is configured to prevent over-insertion of the intermediate rail 105 into the cabinet rail 310. For example, the slide stop assembly 900 may include a protrusion 905 arranged at a first end 910 of the reinforcement bracket 110. The protrusion 905 may be configured to contact a recessed surface 1010 arranged at a first end 1015 of the cabinet rail 310 to restrict further insertion of the intermediate rail 105 into the cabinet rail 310. In another example, the cabinet rail 310 may define an opening 1005 arranged adjacent the first end 1015 of the cabinet rail 310. In some examples, the opening 1005 may be configured to selectively retain the protrusion 905 when the intermediate rail 105 is fully-contracted within the cabinet rail 310. For example, the opening 1005 may receive and retain the protrusion 905 to prevent inadvertent or accidental expansion of the intermediate rail 105 from within the cabinet rail 310. In some examples, other similar configurations may also be possible, including configurations with reversed locations of an opening and a corresponding protrusion.

Figure 12:
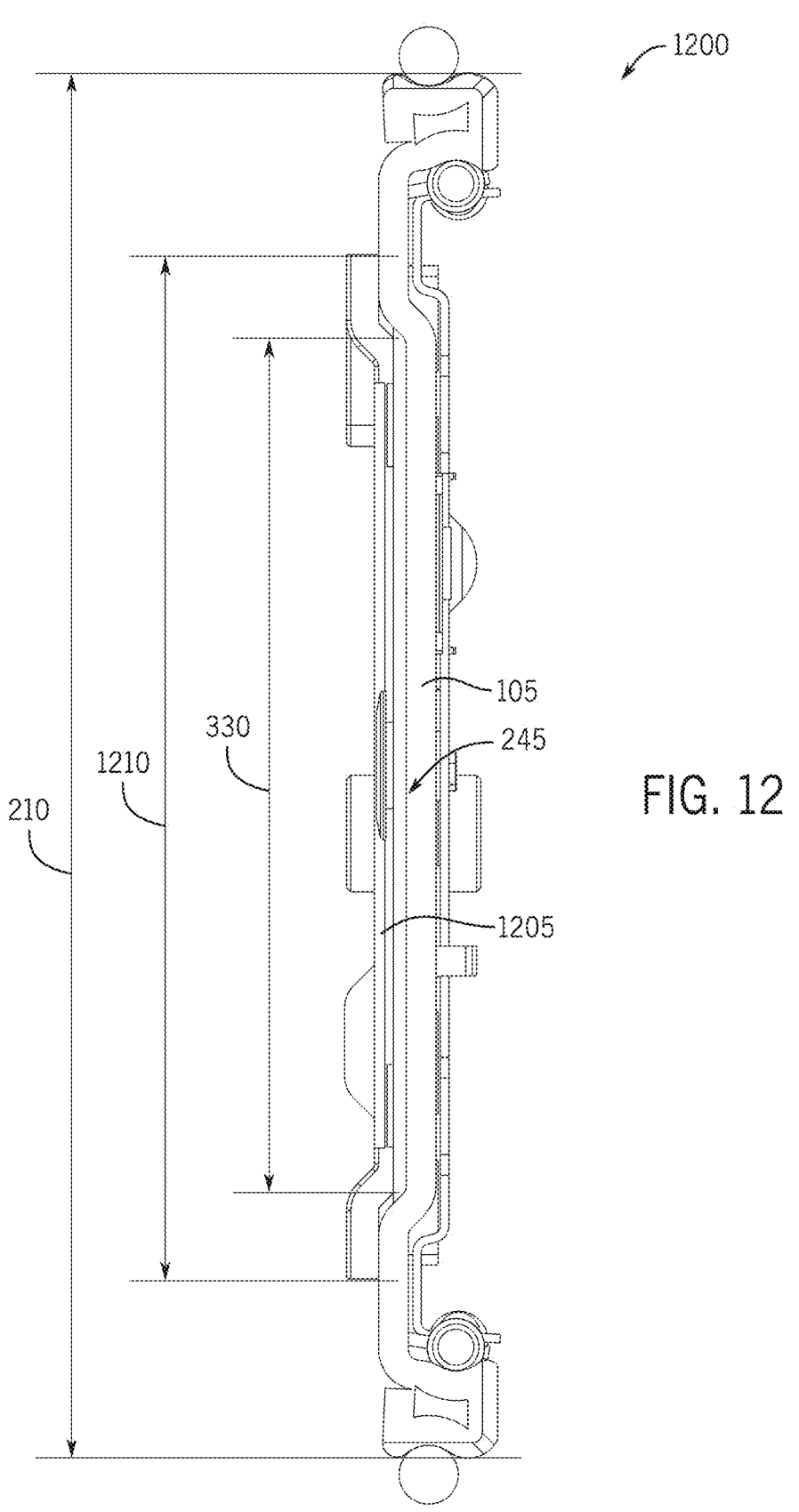
FIG. 12 is a cross-sectional view of another example of a reinforced intermediate rail assembly for use with the server slide assembly of FIG. 1.

FIG. 12 illustrates another example of a reinforced second (e.g., intermediate) rail assembly 1200 that can be used with the server slide assembly 100 of FIG. 3 (e.g., as an alternative configuration of the reinforced second (e.g., intermediate) rail assembly 120). As will be recognized, the reinforced second (e.g., intermediate) rail assembly 1200 shares a number of components in common with and operates in a similar fashion to the examples illustrated and described previously. For the sake of brevity, these common features will not be again described below in detail. Rather, previous discussion of commonly named or numbered features, unless otherwise indicated, also applies to example configurations of the reinforced second (e.g., intermediate) rail assembly 1200.

In one example, the reinforced second (e.g., intermediate) rail assembly 1200 may include a reinforcement bracket 1205 secured to the second (e.g., intermediate) rail 105. The reinforcement bracket 1205 may define a height 1210, which is dimensionally larger than a corresponding height 330 of the recessed portion 245 of the intermediate rail 105, but is dimensionally smaller than a corresponding height 210 of the intermediate rail 105. In one particular example, the height 1210 of the reinforcement bracket 1205 may range from about 10% larger (e.g., 5% larger on either side of recessed portion 245) than the height 330 of the recessed portion 245 to substantially equal to the height 210 of the intermediate rail 105. In one example, a polar moment of inertia of the reinforced intermediate rail assembly 1200 may increase as the height 1210 of the reinforcement bracket 1205 increases, which may provide additional torsional strength to the reinforced intermediate rail assembly 1200.

In some implementations, devices or systems disclosed herein can be utilized, manufactured, or installed using methods embodying aspects of the invention. Correspondingly, any description herein of particular features, capabilities, or intended purposes of a device or system is generally intended to include disclosure of a method of using such devices for the intended purposes, a method of otherwise implementing such capabilities, a method of manufacturing relevant components of such a device or system (or the device or system as a whole), and a method of installing disclosed (or otherwise known) components to support such purposes or capabilities. Similarly, unless otherwise indicated or limited, discussion herein of any method of manufacturing or using for a particular device or system, including installing the device or system, is intended to inherently include disclosure, as embodiments of the invention, of the utilized features and implemented capabilities of such device or system.

In this regard, for example, the disclosed technology includes methods for manufacturing a reinforced intermediate rail assembly (e.g., the reinforced intermediate rail assembly 120). In some examples, a method can include securing a reinforcement bracket (e.g., the reinforcement bracket 110) to a surface of a reinforced rail (e.g., the intermediate rail 105) between the reinforced rail and another rail of the telescoping assembly (e.g., the cabinet rail 310).

In some examples, a method can include securing a first stepped-down portion (e.g., the first stepped-down portion 705) of a first section (e.g., the first section 405) of a pull rod (e.g., the pull rod pull rod 115) to the reinforced rail through a cutout (e.g., the cutout 505) defined by the reinforced rail. In some examples, the method can include securing a stepped-up portion (e.g., the stepped-up portion 715) of both the first section and a second section (e.g., the second section 410) of the pull rod to the reinforcement bracket. In some examples, the method can include securing a second stepped-down portion (e.g., the second stepped-down portion 810) of the second section of the pull rod to the reinforced rail.

In some examples, the method can include preventing separation of the first stepped-down portion of the first section of the pull rod from the surface of the reinforced rail via a projection (e.g., the tooth 510) extending away from an interior surface (e.g., the interior surface 515) of the cutout.

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "either," "one of," "only one of," or "exactly one of." For example, a list of "one of A, B, or C" indicates options of: A, but not B and C; B, but not A and C; and C, but not A and B. A list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of A, one or more of B, and one or more of C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C.

As used herein, unless otherwise defined or limited, directional terms are used for convenience of reference for discussion of particular figures or examples. For example, references to downward (or other) directions or top (or other) positions may be used to discuss aspects of a particular example or figure, but do not necessarily require similar orientation or geometry in all installations or configurations.

Also as used herein, unless otherwise limited or defined, "substantially parallel" indicates a direction that is within ±12 degrees of a reference direction (e.g., within ±6 degrees), inclusive. For a path that is not linear, the path can be considered to be substantially parallel to a reference direction if a straight line between end-points of the path is substantially parallel to the reference direction or a mean derivative of the path within a common reference frame as the reference direction is substantially parallel to the reference direction.

Also as used herein, unless otherwise limited or defined, "substantially perpendicular" indicates a direction that is within ±12 degrees of perpendicular a reference direction (e.g., within ±6 degrees), inclusive. For a path that is not linear, the path can be considered to be substantially perpendicular to a reference direction if a straight line between end-points of the path is substantially perpendicular to the reference direction or a mean derivative of the path within a common reference frame as the reference direction is substantially perpendicular to the reference direction.

Also as used herein, unless otherwise limited or defined, "integral" and derivatives thereof (e.g., "integrally") describe elements that are manufactured as a single piece without fasteners, adhesive, or the like to secure separate components together. For example, an element stamped, cast, or otherwise molded as a single-piece component from a single piece of sheet metal or using a single mold, without rivets, screws, or adhesive to hold separately formed pieces together is an integral (and integrally formed) element. In contrast, an element formed from multiple pieces that are separately formed initially then later connected together, is not an integral (or integrally formed) element.

Additionally, unless otherwise specified or limited, the terms "about" and "approximately," as used herein with respect to a reference value, refer to variations from the reference value of ±15% or less, inclusive of the endpoints of the range. Similarly, the term "substantially equal" (and the like) as used herein with respect to a reference value refers to variations from the reference value of less than ±10%, inclusive. Where specified, "substantially" can indicate in particular a variation in one numerical direction relative to a reference value. For example, "substantially less" than a reference value (and the like) indicates a value that is reduced from the reference value by 10% or more, and "substantially more" than a reference value (and the like) indicates a value that is increased from the reference value by 10% or more.

Also as used herein, unless otherwise limited or specified, "substantially identical" refers to two or more components or systems that are manufactured or used according to the same process and specification, with variation between the components or systems that are within the limitations of acceptable tolerances for the relevant process and specification. For example, two components can be considered to be substantially identical if the components are manufactured according to the same standardized manufacturing steps, with the same materials, and within the same acceptable dimensional tolerances (e.g., as specified for a particular process or product).

The previous description of the disclosed embodiments is provided to enable any person skilled in the art to make or use the invention. Given the benefit of this disclosure, various modifications to these embodiments will be readily apparent to those skilled in the art, and the principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A server slide, comprising:

a first rail; and a reinforced second rail assembly that slidably receives the first rail, the reinforced second rail assembly including:

a second rail having a recessed portion defining a height; and a reinforcement bracket fixed to the second rail, the reinforcement bracket defining a height larger than the height of the recessed portion of the second rail; wherein the reinforcement bracket extends from a first end of the second rail past a midpoint of the second rail.

2. The server slide of claim 1, wherein the height of the reinforcement bracket is substantially equal to an overall height of the second rail.

3. The server slide of claim 1, further comprising:

a third rail that slidably receives the reinforced second rail assembly;

wherein the reinforcement bracket is positioned between the second rail and the third rail.

4. The server slide of claim 3, wherein a surface profile of the reinforcement bracket matches a surface profile of the second rail so that the reinforcement bracket mounts flush with the second rail.

5. The server slide of claim 3, further comprising:

a pull rod secured to extend slidably between the reinforcement bracket and the third rail.

6. The server slide of claim 5, wherein the reinforcement bracket defines a cutout including a projection extending from an interior surface of the cutout, and wherein projection is configured to contact a portion of the pull rod to secure the pull rod to the second rail.

7. The server slide of claim 5, wherein the reinforcement bracket defines a cutout, wherein the pull rod includes a first section and a second section, wherein the first section includes a step transitioning the first section from a first stepped-down portion to a stepped-up portion, and wherein the second section includes a step transitioning the second section from the stepped-up portion to a second stepped-down portion.

8. The server slide of claim 7, wherein the first stepped-down portion is secured to the second rail through the cutout of the reinforcement bracket, the stepped-up portion is secured to the reinforcement bracket, and the second stepped-down portion is secured to the second rail.

9. The server slide of claim 8, wherein the first stepped-down portion is slidably secured to the second rail via one or more first fasteners, wherein the stepped-up portion is slidably secured to the reinforcement bracket via one or more second fasteners, wherein the second stepped-down portion is secured to the second rail via one or more third fasteners, and wherein each of the one or more first, second, and third fasteners extend through only a single material thickness prior to reaching the first stepped-down portion, stepped-up portion, and second stepped-down portion, respectively.

10. The server slide of claim 3, wherein the reinforcement bracket includes a protrusion extending away from the reinforcement bracket towards the third rail adjacent a first end of the reinforcement bracket.

11. The server slide of claim 10, wherein the third rail includes a recessed surface extending away from the third rail towards the reinforcement bracket adjacent a first end of the third rail.

12. The server slide of claim 11, wherein the protrusion of the reinforcement bracket contacts the recessed surface of the third rail to prevent over-insertion of the second rail into the third rail.

13. A method of manufacturing a reinforced slide rail assembly for a server slide, comprising:

arranging a reinforcement bracket so that the reinforce-ment bracket extends along and also out of a recessed portion of a reinforced rail, the reinforcement bracket defining a height larger than a height of the recessed portion of the reinforced rail;

securing the reinforcement bracket to a surface of the reinforced rail; and fastening a pull rod to the reinforced rail and to the reinforcement bracket, with the pull rod secured to reinforced rail through a cutout defined by the rein-forcement bracket.

14. The method of claim 13, wherein fastening the pull rod to the reinforced rail and to the reinforcement bracket includes:

securing a first stepped-down portion of the pull rod to the reinforced rail through the cutout;

securing a first stepped-up portion of the pull rod to the reinforcement bracket; and securing a second stepped-down portion of the pull rod to the reinforced rail.

15. The method of claim 14, further comprising:

further securing the first stepped-down portion of the pull rod using a projection on the reinforcement bracket, the projection extending from an interior surface of the cutout.

* * * * *